United States Patent
Sasaki

(10) Patent No.: US 9,030,887 B2
(45) Date of Patent: May 12, 2015

(54) SEMICONDUCTOR MEMORY DEVICE AND INFORMATION PROCESSING APPARATUS

(71) Applicant: FUJITSU Limited, Kawasaki-shi, Kanagawa (JP)

(72) Inventor: Hirotoshi Sasaki, Fukuoka (JP)

(73) Assignee: FUJITSU Limited, Kawasaki (JP)

( * ) Notice: Subject to any disclaimer, the term of this patent is extended or adjusted under 35 U.S.C. 154(b) by 130 days.

(21) Appl. No.: 13/974,085

(22) Filed: Aug. 23, 2013

(65) Prior Publication Data

US 2014/0078834 A1 Mar. 20, 2014

(30) Foreign Application Priority Data

Sep. 20, 2012 (JP) ................................. 2012-207267

(51) Int. Cl.
| | |
|---|---|
| *G11C 11/41* | (2006.01) |
| *G11C 8/16* | (2006.01) |
| *G11C 7/10* | (2006.01) |
| *G11C 11/412* | (2006.01) |
| *G11C 7/22* | (2006.01) |

(52) U.S. Cl.
CPC ............ *G11C 7/1075* (2013.01); *G11C 7/1006* (2013.01); *G11C 7/22* (2013.01); *G11C 8/16* (2013.01); *G11C 11/412* (2013.01)

(58) Field of Classification Search
CPC .......... G11C 8/16; G11C 7/22; G11C 7/1006; G11C 7/1075; G11C 11/412
See application file for complete search history.

(56) References Cited

U.S. PATENT DOCUMENTS

| | | | |
|---|---|---|---|
| 2009/0109732 A1* | 4/2009 | Houston | ......................... 365/154 |
| 2010/0002531 A1* | 1/2010 | Lee et al. | ....................... 365/226 |

FOREIGN PATENT DOCUMENTS

| | | |
|---|---|---|
| JP | 05-258569 | 10/1993 |
| JP | 07-296585 | 11/1995 |

* cited by examiner

*Primary Examiner* — J. H. Hur
*Assistant Examiner* — Ajay Ojha
(74) *Attorney, Agent, or Firm* — Fujitsu Patent Center

(57) ABSTRACT

A semiconductor memory device includes an address decoder to decode an address specifying pseudo-multiport cells in memory blocks, a first word line driver to output a word line selection signal selecting one of word lines of one of the pseudo-multiport cells based on a row address in the address, and a second word line driver having an output part to output the word line selection signal into one of a pair of the word lines of the pseudo-multiport cell, and a NOR logic part to output NOR of the word line selection signal and a read/write selection signal into the other one of the pair of the word lines, the read/write selection signal selecting writing or reading operations. The second word line driver activates the pair of the word lines for writing data, and activates one of the pair of the word lines for reading data.

5 Claims, 14 Drawing Sheets

SEMICONDUCTOR MEMORY DEVICE AND INFORMATION PROCESSING APPARATUS

CROSS-REFERENCE TO RELATED APPLICATION

This application is based upon and claims the benefit of priority of the prior Japanese Patent Application No. 2012-207267, filed on Sep. 20, 2012, the entire contents of which are incorporated herein by reference.

FIELD

The embodiments discussed herein are related to a semiconductor memory device and an information processing apparatus.

BACKGROUND

There is known in the related art a multiport memory including a read port, a write port, a memory cell array having a plurality of memory cells disposed in an array, and a read/write control circuit. Such a multiport memory generally includes a sub word controller configured to activate a sub word line for selecting a write port memory cell when a write enable signal and a chip enable signal are both valid.

When the related art multiport memory is operated as a single port memory, of a pair of word lines, both word lines are activated when data are retrieved. Hence, power consumption may be increased in this multiport memory case compared to a case where a single port memory fabricated for a single port operation is operated for retrieving data.

Thus, it may be desirable to provide a semiconductor memory device capable of exhibiting reduced electrical power consumption.

RELATED ART DOCUMENTS

Patent Document

Patent Document 1: Japanese Laid-open Patent Publication No. 7-296585

SUMMARY

According to an aspect of the embodiments, there is provided a semiconductor memory device that includes a plurality of memory blocks including a plurality of pseudo-multiport cells; an address decoder configured to decode an address specifying one of the pseudo-multiport cells included in the memory blocks; a first word line driver configured to output a word line selection signal selecting one of word lines of the one of the pseudo-multiport cells included in the memory blocks based on a row address included in the address output from the address decoder; and a second word line driver having an output part configured to output the word line selection signal into a first one of a pair of the word lines of the one of the pseudo-multiport cells included in the memory blocks, and a NOR logic part configured to output a result of NOR of the word line selection signal and a read/write selection signal into a second one of the pair of the word lines, the read/write selection signal selecting one of a writing operation to write data into the one of the pseudo-multiport cells or a reading operation to read data from the one of the pseudo-multiport cells, wherein the second word line driver activates the pair of the word lines for writing data into the one of the pseudo-multiport cells, and activates the first one of the pair of the word lines for reading data from the one of the pseudo-multiport cells.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments will be described with reference to the accompanying drawings. Specifically, a description is given of a semiconductor device and an information processing apparatus to which embodiments are applied.

Initially, a comparative example of a semiconductor memory device is illustrated prior to illustration of the semiconductor memory device of the embodiments.

Comparative Example

Figure 1:
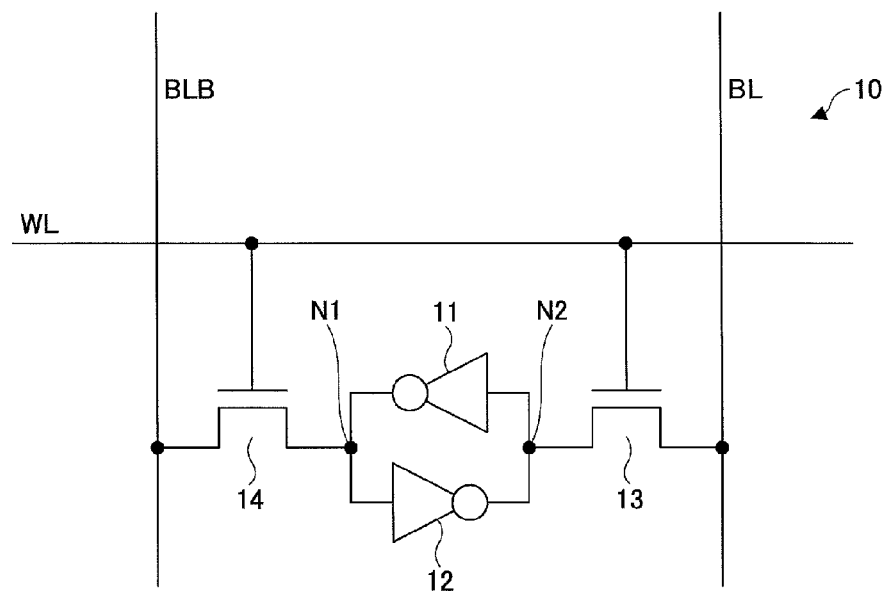
FIG. 1 is a schematic diagram illustrating a structure of a single port bit cell for use in an SRAM.
Figure 2:
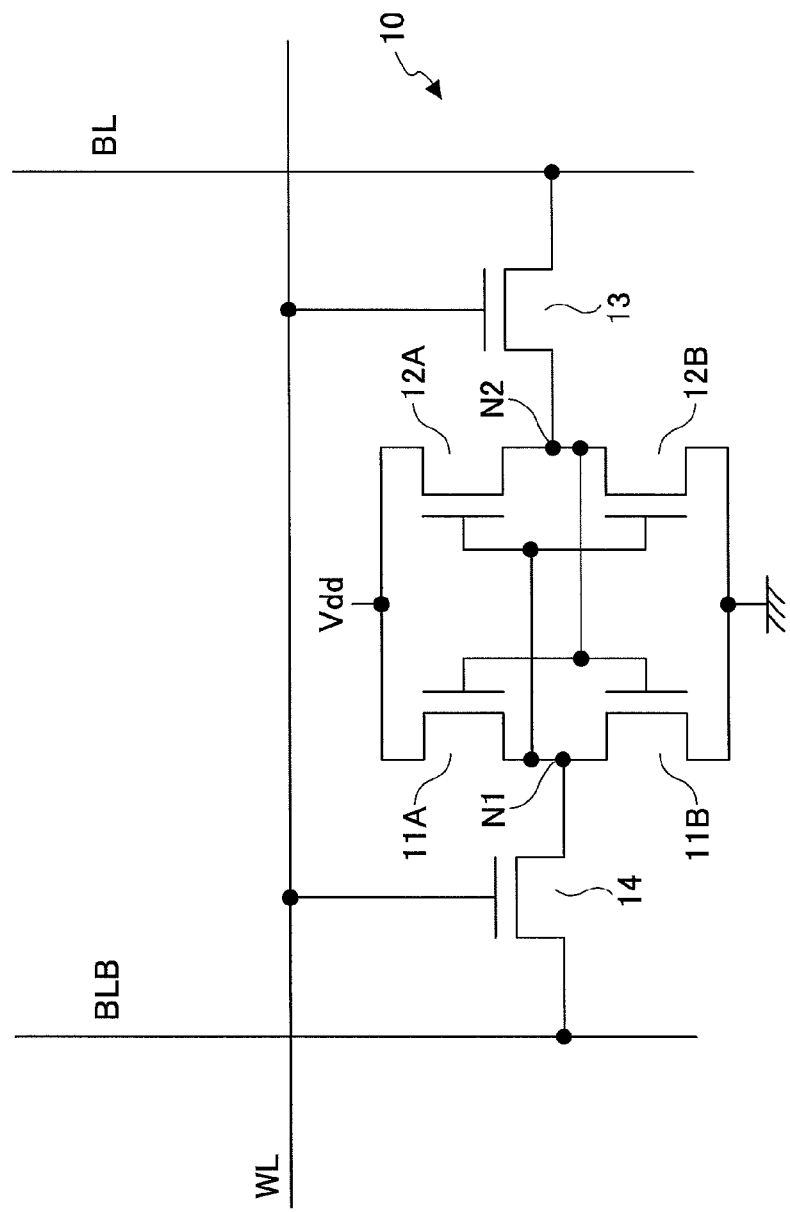
FIG. 2 is a diagram illustrating a detailed structure of the bit cell of FIG. 1.

FIG. 1 is a schematic diagram illustrating a structure of a single port bit cell for use in a static random access memory (SRAM), and FIG. 2 is a diagram illustrating a detailed structure of the bit cell of FIG. 1.

As illustrated in FIG. 1, a bit cell 10 includes a pair of inverters 11 and 12, and n-type metal oxide semiconductor (NMOS) transistors 13 and 14.

The inverters 11 and 12 are mutually connected such that the inverters 11 and 12 form a loop. Respective gates of the NMOS transistors 13 and 14 are connected to a word line WL. A drain of the NMOS transistor 13 is connected to a positive bit line BL whereas a drain of the NMOS transistor 14 is connected to a negative bit line BLB (BL bar).

Further, respective sources of the NMOS transistors 13 and 14 are connected to connectors N1 and N2 of the inverters 11 and 12.

As illustrated in FIG. 2, the inverter 11 is a complementary metal oxide semiconductor (CMOS) inverter including a p-type metal oxide semiconductor (PMOS) transistor 11A and an n-type metal oxide semiconductor (NMOS) transistors 11B. Likewise, the inverter 12 is a complementary metal oxide semiconductor (CMOS) inverter including a p-type metal oxide semiconductor (PMOS) transistor 12A and an n-type metal oxide semiconductor (NMOS) transistors 12B. Specifically, the bit cell 10 illustrated in FIGS. 1 and 2 includes six MOS transistors.

Input/output terminals of the MOS transistors 11A and 11B intersect input/output terminals of the MOS transistors 12A and 12B such that the bit cell 10 is implemented as a latch circuit including the inverters 11 and 12.

The connector N1 between the drains of the MOS transistors 11A and 11B in FIG. 2 corresponds to the connector N1 illustrated in FIG. 1, which serves as a storage node N1. Further, the connector N2 between the drains of the MOS transistors 12A and 12B in FIG. 2 corresponds to the connector N2 illustrated in FIG. 2, which serves as a storage node N2.

Data are retrieved from, or written into the storage nodes N1 and N2 by causing the storage nodes N1 and N2 to store complementary data of "1", "0", or "0", "1", and selecting the bit cell 10 by driving the word line WL and the pair of the bit lines BL and BLB.

For retrieving data, when the word line WL is driven by switching the pair of bit lines BL and BLB into a high (H) level, one of the bit lines BL and BLB is switched to a low (L) level by a corresponding one of the storage nodes N1 and N2, thereby outputting data as retrieved (read) data.

On the other hand, for writing data, the word line WL is driven by switching one of the bit lines BL and BLB to a high (H) level and the other one of bit lines BL and BLB to a low (L) level, thereby writing data into the storage nodes N1 and N2.

In the bit cell 10 illustrated in FIGS. 1 and 2 is a six-transistor bit cell. This type of the bit cell is not capable of retrieving and writing data simultaneously so that retrieving data and writing data are performed in different cycles.

Figure 3:
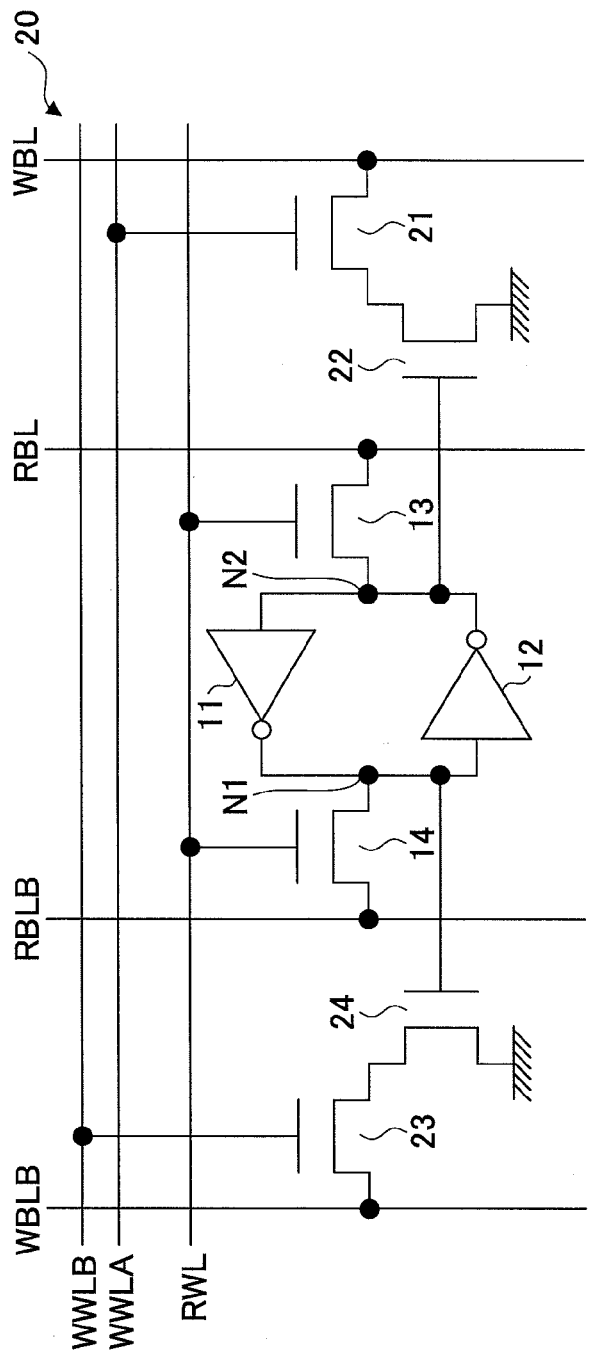
FIG. 3 is a diagram illustrating a 10 transistor multiport bit cell.

FIG. 3 is a diagram illustrating a 10 transistor multiport bit cell. The multiport bit cell 10 illustrated in FIG. 3 includes two inverters 11 and 12, and six transistors 13, 14, 21, 22, 23, and 24.

The respective two inverters 11 and 12 in FIG. 3 are identical to the inverters 11 and 12 included in the single port bit cell 10 illustrated in FIG. 1. Each of the inverters 11 and 12 includes two transistors (see FIG. 2). Hence, those parts that are the same are designated by the same reference numerals, and a description thereof will be omitted.

The multiport bit cell 20 includes three word lines, namely, two write word lines WWLA and WWLB, and one read word line RWL. The multiport bit cell 20 further includes two pairs of bit lines (i.e., four bit lines), namely, a positive write bit line WBL, a negative write bit line WBLB (WBL bar), a positive read bit line RBL, and a negative read bit line RBLB (RBLB bar).

Respective gates of the NMOS transistors 13 and 14 are connected to the read word line RWL. A drain of the NMOS transistor 13 is connected to the read bit line RBL, and a source of the NMOS transistor 13 is connected to the storage node N2. Likewise, a drain of the NMOS transistor 14 is connected to the read bit line RBLB, and a source of the NMOS transistor 14 is connected to the storage node N1.

A gate of the NMOS transistors 21 is connected to the write word line WWLA. A drain of the NMOS transistor 21 is connected to the write bit line WBL, and a source of the NMOS transistor 21 is connected to a drain of the NMOS transistor 22. Likewise, the drain of the NMOS transistor 22 is connected to the source of the transistor 21, a source of the NMOS transistor 22 is grounded, and a gate of the NMOS transistor 22 is connected to the storage node N2.

A gate of the NMOS transistors 23 is connected to the write word line WWLB. A drain of the NMOS transistor 23 is connected to the write bit line WBLB, and a source of the NMOS transistor 23 is connected to a drain of the NMOS transistor 24.

Likewise, the drain of the NMOS transistor 24 is connected to the source of the transistor 23, a source of the NMOS transistor 24 is grounded, and a gate of the NMOS transistor 24 is connected to the storage node N1.

To retrieve data, the bit cell 20 is selected by driving the read word line RWL, and the read bit lines RBL and RBLB.

To write data, the bit cell 20 is selected by driving the write word lines WWLA and WWLB, and the write bit lines WBL and WBLB.

The bit cell 20 includes the transistors 13 and 14 used for retrieving data, and the transistors 21, 22, 23 and 24 for writing data. Since the bit cell 20 uses different word lines and bit lines for retrieving data and writing data, retrieving (reading) and writing operations may be performed simultaneously.

Figure 4:
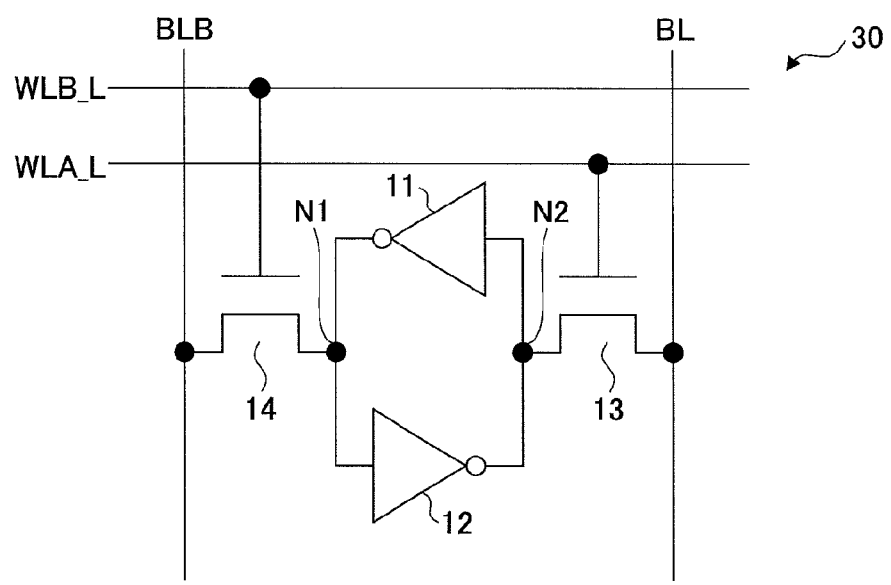
FIG. 4 is a diagram illustrating a pseudo-multiport bit cell 30.

FIG. 4 is a diagram illustrating a pseudo-multiport bit cell 30.

As illustrated in FIG. 4, in the bit cell 30, a gate of the NMOS transistor 13 connected to the bit line BL is connected to a word line WLA_L, and a gate of the NMOS transistor 14 connected to the bit line BLB is connected to a word line WLB_L.

Other parts of the configuration of the bit cell 30 are similar to those of the configuration of the bit cell 10 illustrated in FIG. 1.

In the bit cell 30, for retrieving data, a pair of the bit lines BL and BLB is selected while the pair of the word lines WLA_L and WLB_L is switched to the H level to retrieve data from the storage nodes N1 and N2 of the bit cell 30.

Further, for writing data, the bit lines BL and BLB are selected while the word lines WLA_L and WLB_L are switched to the H level to write data into the storage nodes N1 and N2 of the bit cell 30.

Thus, the pseudo-multiport bit cell 30 is capable of writing data in the storage nodes N1 and N2 while simultaneously retrieving two sets of data retained in the storage nodes N1 and N2. The pseudo-multiport bit cell 30 may construct a so-called 2 read-1 write (2R1W) type SRAM.

Figure 5:
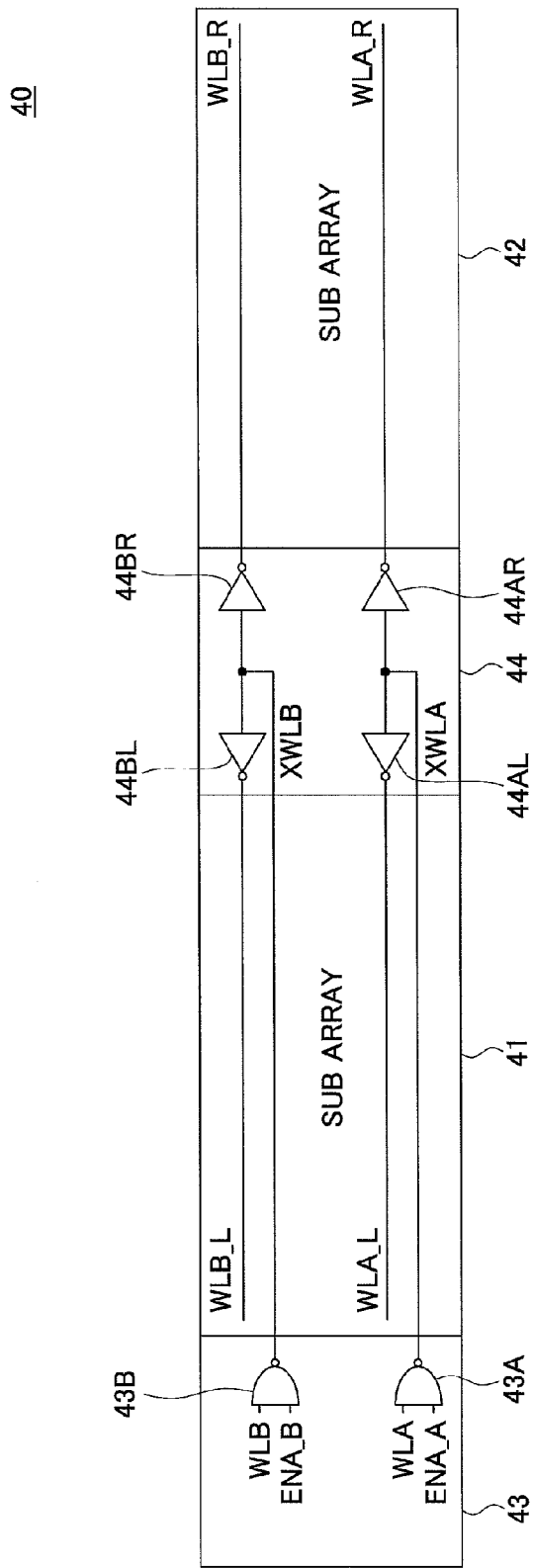
FIG. 5 is a diagram illustrating an SRAM 40 including a comparative example of the pseudo-multiport bit cell 30.

Next, a description is given of an SRAM 40 including a comparative example of the pseudo-multiport bit cell 30 with reference to FIG. 5.

FIG. 5 is a diagram illustrating the SRAM 40 including the comparative example of the pseudo-multiport bit cell 30.

The SRAM 40 includes sub arrays 41 and 42, a word line driver 43, and a final word line driver 44 as main components.

The sub arrays 41 and 42 include a plurality of the pseudo-multiport bit cells 30. For convenience of illustration, in FIG. 5, word lines WLA_L and WLB_L are illustrated inside the sub array 41, and word lines WLA_R and WLB_R are illustrated inside the sub array 42.

The word lines WLA_L and WLB_L illustrated inside the sub array 41 correspond to the word lines WLA_L and WLB_L illustrated in FIG. 4. Suffixes "_L" of the word lines WLA_L and WLB_L indicate that the sub array 41 resides on the left hand side of the final word line driver 44 in FIG. 5.

Further, the word lines WLA_R and WLB_R illustrated inside the sub array 42 are a pair of word lines similar to the word lines WLA_L and WLB_L illustrated in FIG. 4. Since the sub array 42 resides on the right hand side of the final word line driver 44, the word lines illustrated inside the sub array 42 are provided with a suffix "_R".

Thus, in FIG. 5, the word lines WLA_L and WLB_L are illustrated in the sub array 41, and the word lines WLA_R and WLB_R are illustrated in the sub array 42.

However, in practice, there is a plurality of pairs of the word lines WLA_L and WLB_L inside the sub array 41, such that a plurality of pseudo-multiport bit cells 30 is disposed in a row direction (i.e., a vertical direction in FIG. 5). Likewise, there is a plurality of pairs of the word lines WLA_R and WLB_R inside the sub array 42, such that a plurality of pseudo-multiport bit cells 30 is disposed in the row direction (i.e., the vertical direction in FIG. 5).

Further, though not illustrated in FIG. 5, a plurality of pairs of bit lines is disposed inside the sub arrays 41 and 42, and the pairs of the bit lines are connected to the pseudo-multiport bit cells 30. Note that illustration of drivers to drive the bit lines or the like are omitted from FIG. 5.

As described above, each of the sub arrays 41 and 42 includes the plurality of the pseudo-multiport bit cells 30 disposed in a matrix.

The word line driver 43 is disposed adjacent to the sub array 41. The word line driver 43 includes NAND logic parts 43A and 43B. The NAND logic part 43A is supplied with a word line selection signal WLA and an enable signal ENA_A. The NAND logic part 43B is supplied with a word line selection signal WLB and an enable signal ENA_B.

FIG. 5 illustrates a pair of A word lines (WLA_L/WLA_R) and B word lines (WLB_L/WLB_R). However, in practice, there is a plurality of the pairs of the A word lines (WLA_L/WLA_R) and the B word lines (WLB_L/WLB_R) corresponding to the bit cells 30 disposed in a matrix as described above.

Accordingly, in practice, there are plural of the NAND logic parts 43A and 43B disposed corresponding to the plurality of the pairs of the A word lines (WLA_L/WLA_R) and B word lines (WLB_L/WLB_R).

The word line selection signal WLA is a selection signal for selecting a specific word line WLA_L of the plural word lines WLA_L and a specific word line WLA_R of the plural word lines WLA_R. The enable signal ENA_A is an enabling signal for activating the word lines WLA_L and WLA_R.

The word lines WLA_L and WLA_R are activated and switched to a high (H) level when the word line selection signal WLA and the enable signal ENA_A supplied to the NAND logic part 43A are both at a high (H) level.

The word line selection signal WLB is a selection signal for selecting a specific word line WLB_L of the plural word lines WLB_L and a specific word line WLB_R of the plural word lines WLB_R. The enable signal ENA_B is an enabling signal for activating the word lines WLB_L and WLB_R.

The word lines WLB_L and WLB_R are activated and switched to a high (H) level when the word line selection signal WLB and the enable signal ENA_B supplied to the NAND logic part 43B are both at a high (H) level.

The final word line driver 44 is disposed between the sub arrays 41 and 42. The final word line driver 44 includes inverters 44AL, 44AR, 44BL, and 44BR.

Respective input terminals of the inverters 44AL and 44AR are connected to an output terminal of the NAND logic part 43A of the word line driver 43. An output terminal of the inverter 44AL is connected to the word line WLA_L of the sub array 41, and an output terminal of the inverter 44AR is connected to the word line WLA_R of the sub array 42.

The inverters 44AL and 44AR are configured to invert a selection signal XWLA output from the NAND logic part 43A, and output the inverted selection signal XWLA to the respective word lines WLA_L and WLA_R. The selection signal XWLA is a signal obtained by inverting a word line selection signal WLA.

Hence, when the enable signal ENA_A is at a high (H) level, the selection signal WLA is equal to output signals of the inverters 44AL and 44AR. That is, the word lines WLA_L and WLA_R receive a signal having a signal level equal to that of the selection signal WLA.

Respective input terminals of the inverters 44BL and 44BR are connected to an output terminal of the NAND logic part 43B of the word line driver 43. An output terminal of the inverter 44BL is connected to the word line WLB_L of the sub array 41, and an output terminal of the inverter 44BR is connected to the word line WLB_R of the sub array 42.

The inverters 44AL and 44AR are configured to invert a selection signal XWLB output from the NAND logic part 43B, and output the inverted selection signal XWLB to the respective word lines WLB_L and WLB_R. The selection signal XWLB is an inverted signal of the word line selection signal WLB, that is, a signal obtained by inverting a word line selection signal WLB.

Hence, when the enable signal ENA_B is at a high (H) level, the selection signal WLB is equal to output signals of the inverters 44BL and 44BR. That is, the word lines WLB_L and WLB_R receive a signal having a signal level equal to that of the selection signal WLB.

As described above, the word line driver 43 may need to individually control two word lines WLA_L and WLB_L to operate the pseudo-multiport bit cells 30 (see FIG. 4) included in the sub array 41 as a multiport for retrieving and writing data.

Similarly, the word line driver 43 may need to individually control two word lines WLA_R and WLB_R to operate the pseudo-multiport bit cells (see FIG. 4) included in the sub array 42 as a multiport for retrieving and writing data.

Thus, the word line driver 43 may need to individually control the A word line (WLA_L/WLB_L) and the B word line (WLA_R/WLB_R) to operate the pseudo-multiport bit cells 30 (see FIG. 4) included in the sub arrays 41 and 42 as a multiport for retrieving and writing data.

Figure 6:
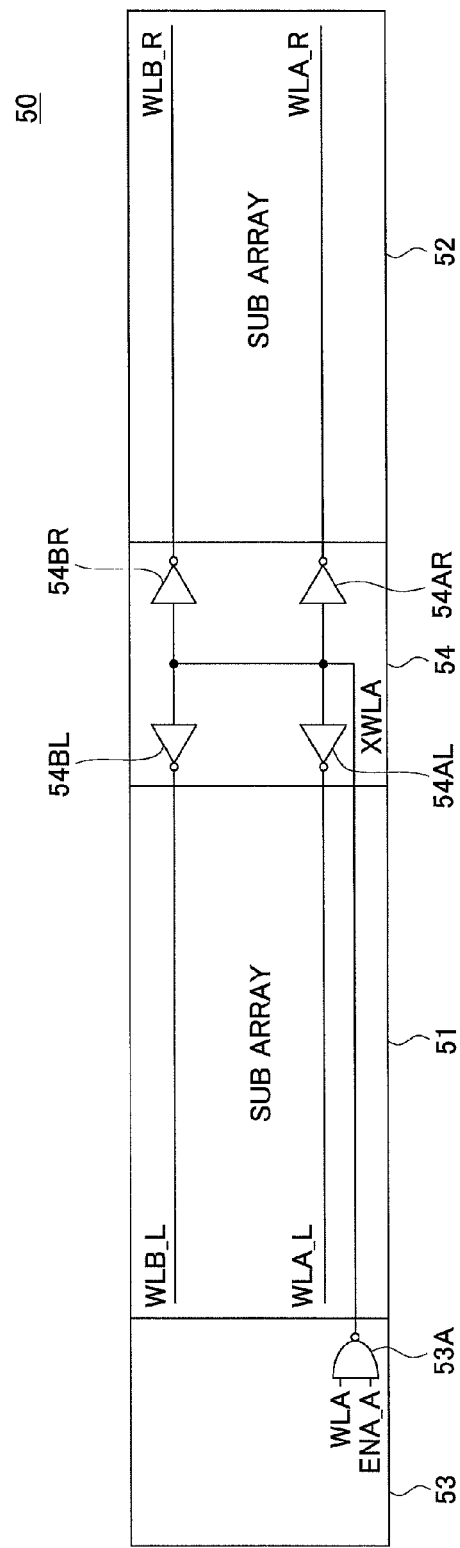
FIG. 6 is a diagram illustrating a comparative example of an SRAM 50 including the pseudo-multiport bit cell 30.

Next, a description is given of an SRAM 50 operating the pseudo-multiport bit cells 30 (see FIG. 4) as a single port bit cell with reference to FIG. 6.

FIG. 6 is a diagram illustrating the SRAM 50 including the comparative example of the pseudo-multiport bit cell 30.

The SRAM 50 includes sub arrays 51 and 52, a word line driver 53, and a final word line driver 54 as main components.

The sub arrays 51 and 52 include a plurality of the pseudo-multiport bit cells 30 (see FIG. 4) disposed in a matrix in a manner similar to the sub arrays 41 and 42 of the SRAM 40 illustrated in FIG. 5. However, the sub arrays 51 and 52 differ from the sub arrays 41 and 42 in that each of the pseudo-multiport bit cells 30 included in the sub arrays 51 and 52 is operated as a single port bit cell.

Note that, though not illustrated in FIG. 6, a plurality of pairs of bit lines is disposed inside the sub arrays 51 and 52, and the pairs of the bit lines are connected to the pseudo-multiport bit cells 30. Note that illustration of drivers to drive the bit lines or the like is omitted from FIG. 6.

Note that the operation as a single port bit cell indicates that data are retrieved by utilizing one of the word lines of the pair. For example, when the multiport bit cell is utilized as a single port bit cell, a part of the multiport bit cell fabricated in a large scale integrated circuit (LSI) may be operated as a single port bit cell.

When the part of the multiport bit cell is operated as a single port bit cell, it may be possible to reduce fabrication cost of memory or the like formed of the LSI, cancel out fabrication variability in the bit cells operating as the multiport bit cells and the bit cells operating as the single port bit cells, and improve the operating properties.

Accordingly, in the following, a case where the pseudo-multiport bit cell 30 is operated as a single port bit cell is examined.

In order to operate each of the pseudo-multiport bit cells 30 as a single port bit cell, the A word line (WLA_L/WLA_R) and the B word line (WLB_L/WLB_R) in the sub arrays 51 and 52 are activated by common control signals.

The word line driver 53 is disposed adjacent to the sub array 51 and includes a NAND logic part 53A. The NAND logic part 53A is supplied with a word line selection signal WLA and an enable signal ENA_A. The word line selection signal WLA and the enable signal ENA_A are the control signals similar to the word line selection signal WLA and the enable signal ENA_A of the SRAM 40 illustrated in FIG. 5.

FIG. 6 illustrates one of each of the A word lines WLA_L and WLA_R; however, in practice, there is a plurality of A word lines WLA_L and WLA_R corresponding to the bit cells 30 disposed in a matrix. Accordingly, in practice, there is a plurality of the NAND logic parts 53A disposed corresponding to the A word lines WLA_L and WLA_R.

An output terminal of the NAND logic part 53A is connected to input terminals of inverters 54AL, 54AR, 54BL, and 54BR of the final word line driver 54 disposed between the sub arrays 51 and 52.

The final word line driver 54 includes the inverters 54AL, 54AR, 54BL, and 54BR. Respective input terminals of the inverters 54AL, 54AR, 54BL, and 54BR are connected to the output terminal of the NAND logic part 53A of the word line driver 53.

Hence, the inverters 54AL, 54AR, 54BL, and 54BR are supplied with a selection signal XWLA as a common control signal from the NAND logic part 53A of the word line driver 53. This is because each of the pseudo-multiport bit cells 30 (see FIG. 4) included in the SRAM 50 is operated as a single port bit cell.

Figure 7:
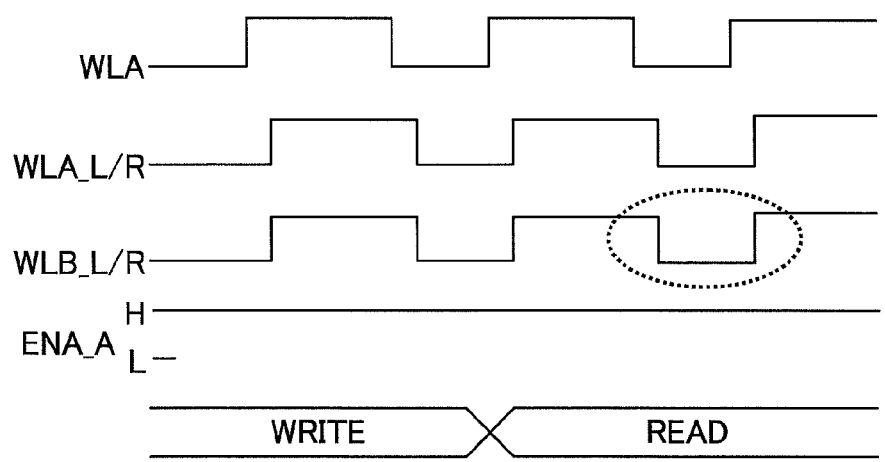
FIG. 7 is a timing chart illustrating operations of the comparative example of the SRAM 50.

In the SRAM 50 illustrated in FIG. 6, since each of the pseudo-multiport bit cells 30 is driven as single port memory, driving signals input into the A word lines (WLA_L/ WLA_R) and the B word lines (WLB_L/WLB_R) form respective operating waveforms illustrated in FIG. 7.

FIG. 7 is a timing chart illustrating operations of the SRAM 50. In FIG. 7, the A word lines (WLA_L/WLA_R) are represented by WLA_L/R, and the B word lines (WLB_L/ WLB_R) are represented by WLB_L/R.

The driving signals input into the A word lines (WLA_L/R) and the B word lines (WLB_L/R) are inverted selection signals XWLA. The inverted selection signals XWLA are obtained by inverting the selection signals XWLA output by the NAND logic part 53A of the word line driver 53 by inverters 54AL, 54AR, 54BL, and 54BR.

That is, the driving signals input into the A word lines (WLA_L/R) and the B word lines (WLB_L/R) are signals reflecting a high (H)/low (L) level of the word line selection signal WLA while the enable signal ENA_A input into the NAND logic part 53A maintaining a high (H) level as illustrated in FIG. 7.

Note that when data are written into the SRAM 50 (WRITE operating time), data may need to be written into both the storage nodes N1 and N2 of the bit cell 30 illustrated in FIG. 4.

Hence, when data are written into the SRAM (WRITE operating time), the A word lines (WLA_L/R) and the B word lines (WLB_L/R) both need to be activated.

On the other hand, when data are retrieved from the SRAM 50 (READ operating time), data may need to be retrieved from any one of the storage nodes N1 and N2 of the bit cell 30 illustrated in FIG. 4; that is, it is not necessary to retrieve data from both the storage nodes N1 and N2. This is because the data retained in the bit cell 30 may be detectable by retrieving the data of one of the storage nodes N1 and N2.

Hence, when data are retrieved from the SRAM 50 (READ operating time), it is sufficient to activate one of the A word lines (WLA_L/R) and the B word lines (WLB_L/R). Hence, when the A word lines (WLA_L/R) are activated to retrieve data from the SRAM 50, the B word lines (WLB_L/R) need not be activated, for example.

However, in the comparative example of the SRAM 50 in FIG. 6, the B word lines (WLB_L/R) are activated as indicated by an oval broken line in FIG. 7 when data are retrieved (READ operating time). This may require fundamentally unnecessary extra electrical power consumption.

To prevent unnecessary extra electrical power consumption, it is necessary to configure a circuit such that both the A word lines (WLA_L/R) and the B word lines (WLB_L/R) are activated when data are written, whereas one of the A word lines (WLA_L/R) and the B word lines (WLB_L/R) is activated when data are retrieved.

In the following, a circuit in which any one of the A word lines (WLA_L/R) and the B word lines (WLB_L/R) is activated when data are retrieved is examined with reference to FIG. 8.

Figure 8:
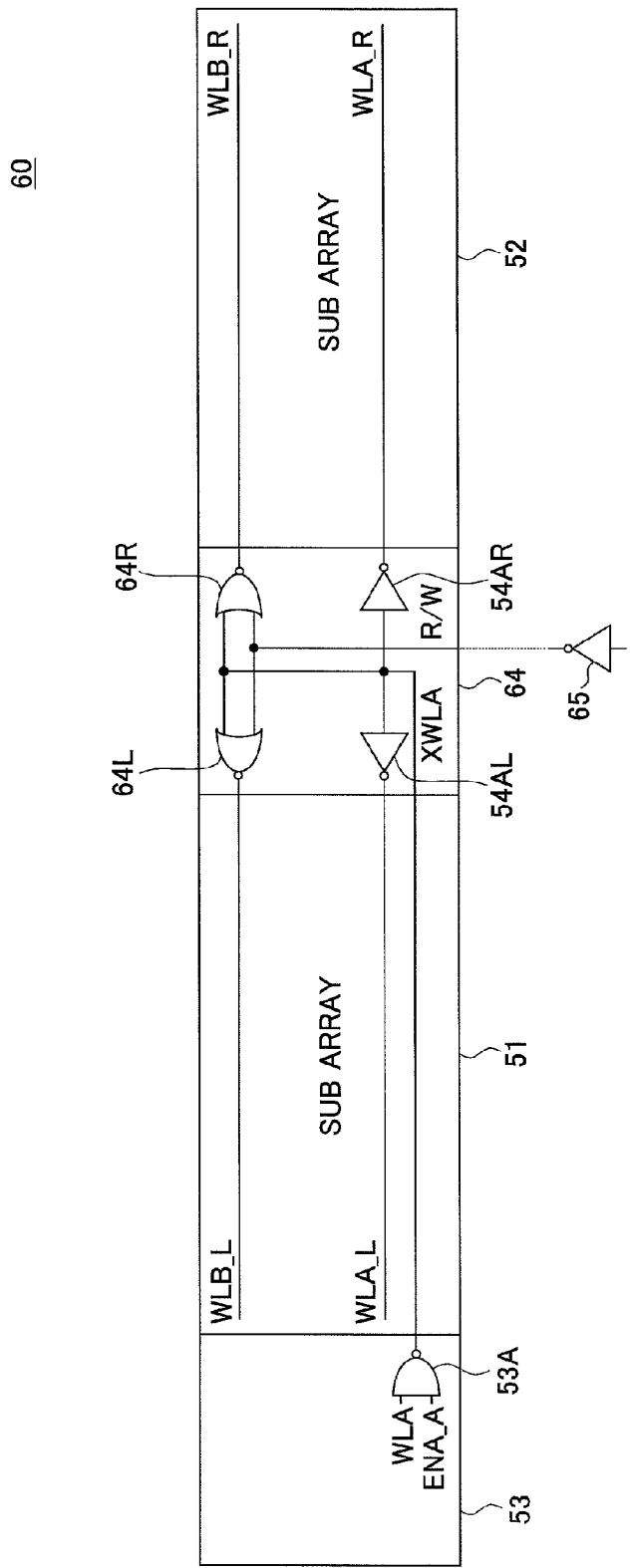
FIG. 8 is a diagram illustrating a comparative example of an SRAM 60.

FIG. 8 is a diagram illustrating a comparative example of an SRAM 60.

The SRAM 60 includes sub arrays 51 and 52, a word line driver 53, and a final word line driver 64 as main components. The SRAM 60 includes a configuration in which the final word line drive 54 of the SRAM 50 illustrated in FIG. 6 is modified.

Hence, the sub arrays 51 and 52, and the word line driver 53 are similar to those of the SRAM 50 illustrated in FIG. 6, and duplicated description will thus be omitted.

Note that illustration of the bit lines and drivers to drive the bit lines or the like disposed inside the sub arrays 51 and 52 are omitted from FIG. 8 in a manner similar to the illustration in FIG. 6.

The final word line driver 64 includes the inverters 54AL and 54AR, and NOR logic parts 64L and 64R. The configurations of the inverters 54AL and 54AR are similar to those of the inverters 54AL and 54AR of the final word line driver 54 illustrated in FIG. 6.

The final word line driver 64 receives a switching signal R/W input from an inverter 65. The inverter 65 is included in a local control block (not illustrated in FIG. 6) of the SRAM 60, and is configured to output the switching signal R/W obtained by inverting a write enable signal.

In this case, a low (L) level of the write enable signal enables write (WRITE) operations whereas a high (H) level of the write enable signal disenables write (WRITE) operations. That is, the H level of the write enable signal is a signal level at which read (READ) operations are enabled.

The switching signal R/W is at L level when the write enable signal is at L level whereas the switching signal R/W is at H level when the write enable signal is at H level. As an example, the L level of the switching signal R/W is defined as a signal level when the write (WRITE) operations are performed whereas the H level of the switching signal R/W is defined as a signal level when the read (READ) operations are performed.

First input terminals (see upper input terminals in FIG. 8) of the NOR logic parts 64L and 64R are connected to the output terminal of the NAND logic part 53A of the word line driver 53. Second input terminals (see lower input terminals in FIG. 8) of the NOR logic parts 64L and 64R are connected to the output terminal of the inverter 65.

In the following, a description is given of operations of the SRAM 60.

Figure 9:
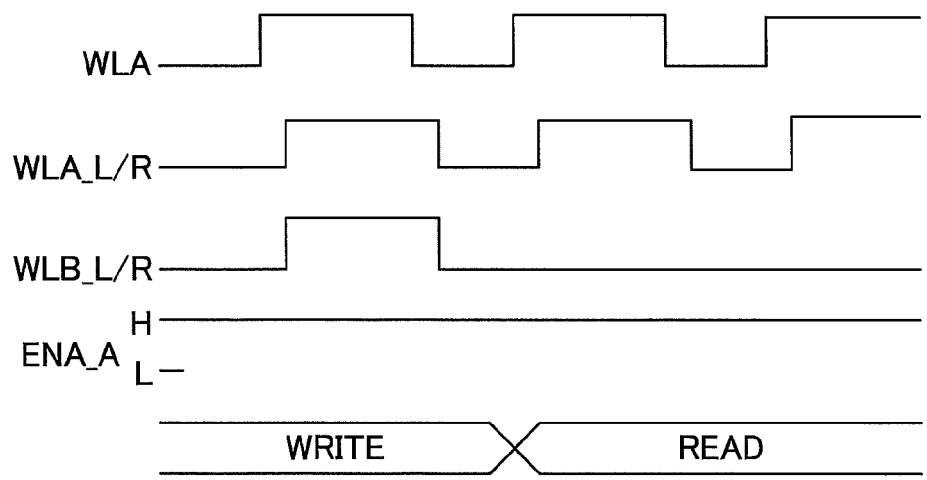
FIG. 9 is a timing chart illustrating operations of the comparative example of the SRAM 60.

FIG. 9 is a timing chart illustrating the operations of the SRAM 60.

When the write (WRITE) operations are performed, the switching signal R/W output by the inverter 65 is at L level, and the output signals of the NOR logic parts 64L and 64R are at a signal level identical to those of the inverters 54AL and 54AR.

Hence, when the write (WRITE) operations are performed, the driving signal reflecting the signal level of the word line selection signal WLA is supplied to both the A word lines (WLA_L/R) and the B word lines (WLB_L/R), as illustrated in FIG. 9.

On the other hand, when the read (READ) operations are performed, the switching signal R/W output by the inverter 65 is at H level, and the output signals of the NOR logic parts 64L and 64R are retained at L level regardless of a signal level of the selection signal XWLA.

Hence, when the read (READ) operations are performed, the driving signal reflecting the signal level of the word line selection signal WLA is supplied to the A word lines (WLA_L/R), as illustrated in FIG. 9. At the same time, the driving signal supplied to the B word lines (WLB_L/R) is retained at L level, as illustrated in FIG. 9. That is, the B word lines (WLB_L/R) will not be activated when the read (READ) operations are performed.

Hence, since the B word lines (WLB_L/R) need not be activated when the read (READ) operations are performed, fundamentally unnecessary extra electrical power consumption will not be required for driving each of the pseudo-multiport bit cells 30 as single port memory as indicated by the oval broken line in FIG. 7.

Note that the final word line driver 64 of the SRAM 60 illustrated in FIG. 8 includes the NOR logic parts 64L and 64R.

In general, when an inverter is fabricated with a large scale integrated circuit (LSI), a NOR circuit needs to have a size (an area) twice or more the size (the area) of the inverter. Hence, the electrical power consumption increases approximately in proportion to the size (the area) of the NOR circuit.

Further, in order for the two NOR logic parts 64L and 64R to output the driving signal having a signal level sufficient for the B word lines (WLB_L/R), the inverter 65 needs to have a size (an area) approximately around eight times of the NOR logic parts 64L and 64R. Hence, the electrical power consumption increases approximately in proportion to the size (the area) of the inverter 65.

As described above, in the SRAM 60 illustrated in FIG. 8, even if the B word lines are not activated to perform the read (READ) operations, the electrical power consumption in the final word line driver 64 increases. Hence, the electrical power consumption will not be reduced as a total.

Accordingly, the electrical power consumption will not be reduced when the comparative examples of the SRAMs 50 and 60 including the pseudo-multiport bit cells 30 are operated as a single port memory.

The multiport bit cell 30 is operated as a single port memory. Hence, when a part of the multiport bit cells fabricated in a large scale integrated circuit (LSI) is operated as a single port bit cell, cost of the memory or the like may be reduced. In addition, it may be possible to cancel out fabrication variability in the bit cells operating as the multiport bit cells and the bit cells operating as the single port bit cells, and improve the operating properties.

Thus, it may be desirable to provide a semiconductor memory device capable of exhibiting reduced electrical power consumption.

Embodiment

Figure 10:
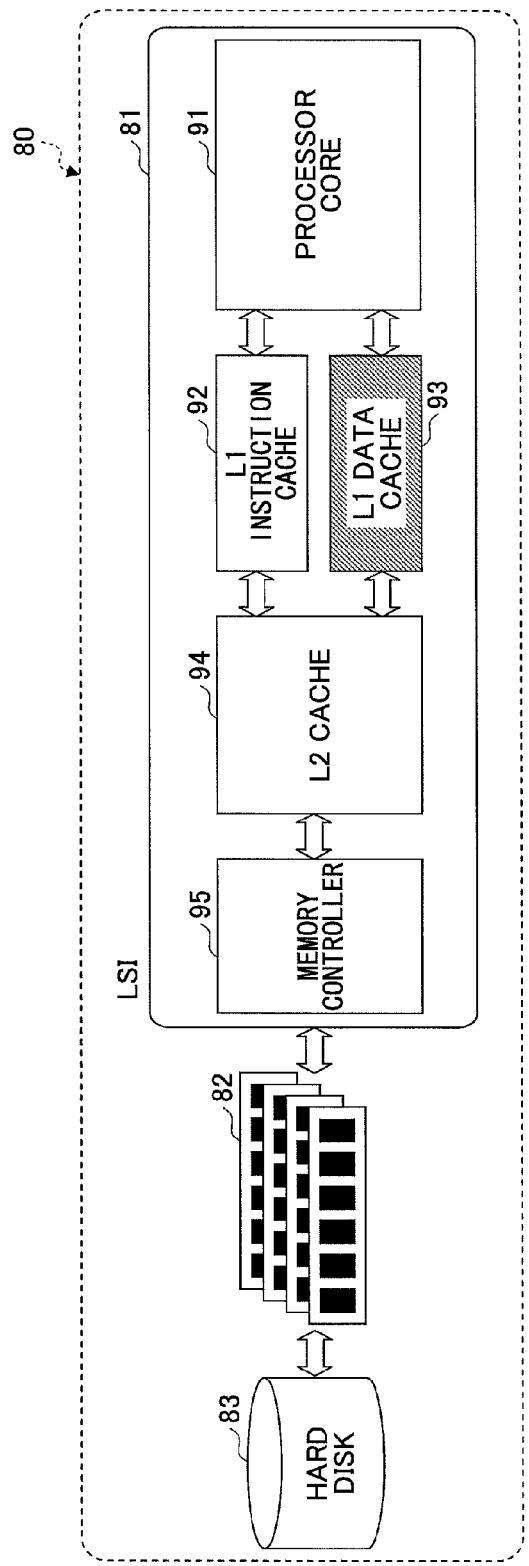
FIG. 10 is a diagram illustrating an information processing apparatus including a semiconductor memory device of an embodiment.

FIG. 10 is a diagram illustrating an information processing apparatus including a semiconductor memory device of an embodiment.

In the following, a description will be given of an embodiment in which an information processing apparatus serves as a server 80.

As illustrated in FIG. 10, the server 80 includes a large scale integrated circuit (LSI) 81, a main storage device 82, and auxiliary storage device 83. An interval between the LSI 81 and the main storage device 82, and an interval between the main storage device 82 and the auxiliary device 93 may, for example, be connected by designated buses, respectively.

The LSI 81 includes a processor core 91, a level 1 (L1, primary) instruction cache 92, a L1 data cache 93, a level 2 (L2, secondary) cache 94, and a memory controller 95.

The processor core 91 may, for example, be a central processing unit (CPU) core serving as an arithmetic processing unit configured to perform arithmetic processing of the server 80 as information processing apparatus. Note that the processor core 91, the L1 instruction cache 92, and the L1 data cache 91 may be integrated as a CPU. There may be two or more processor cores 91. In this case, each of the processor cores 91 is connected one L1 instruction cache 92 and one L1 data cache 93.

The L1 instruction cache 92 is a primary cache configured to temporarily store programs necessary for arithmetic processing of the processor core 91. The L1 instruction cache 92 may, for example, be formed of an SRAM.

The L1 data cache 93 is a primary data cache configured to temporarily store data necessary for the arithmetic processing of the processor core 91, or data generated as a result of the arithmetic processing. In this embodiment, a description will be given of a case in which an SRAM serving as the semiconductor memory device of the embodiment is applied to the L1 data cache 93. Note that details of the structure of the embodiment will be described later.

The L2 cache 94 is a cache close to a main storage device 92 and located at a level lower than the L1 instruction cache 92 and the L1 data cache 93 in the memory hierarchical structure. The L2 cache 94 typically includes a processing speed lower than those of the L1 instruction cache 92 and the L1 data cache 93; however, the L2 cache includes a large capacity. The L2 instruction cache 94 may, for example, be formed of an SRAM.

The memory controller 95 is a control device configured to perform control when the LSI performs data read operations or data write operations between the LSI and the main storage device 82. The memory controller 95 may be formed of an LSI.

The main storage device 82 may, for example, be a dynamic random access memory (DRAM) and a read only memory (ROM), and the auxiliary storage device 93 may, for example, be a hard disk.

Note that the server 80 may include a data input/output interface configured to perform communications with external apparatuses.

Figure 11:
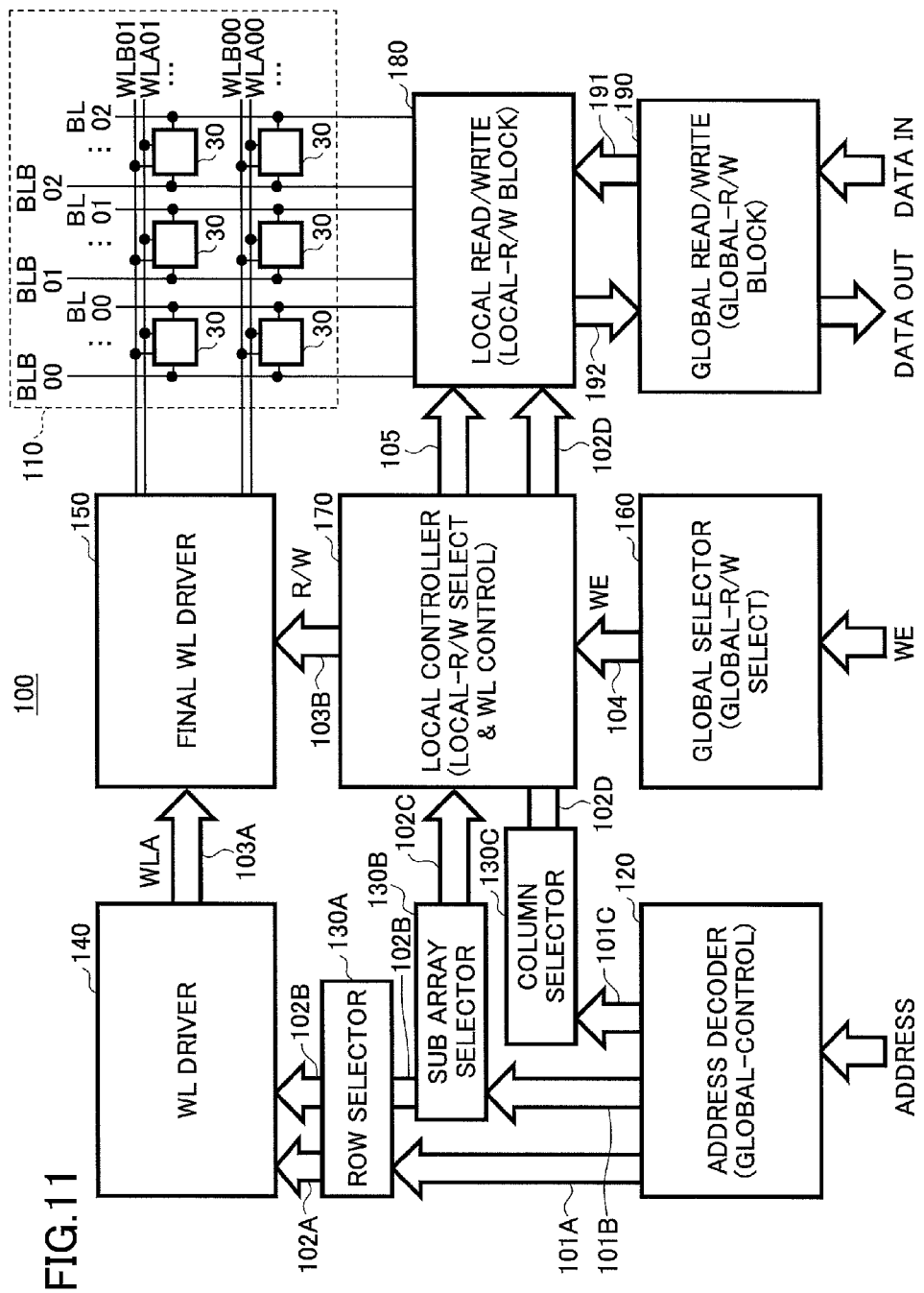
FIG. 11 is a diagram illustrating an SRAM 100 of an embodiment.

FIG. 11 is a diagram illustrating an SRAM 100 of an embodiment. FIG. 11 illustrates not a physical arrangement of the SRAM 100, but is a block diagram illustrating a connecting relationship of the components of the SRAM 100.

The SRAM 100 of the embodiment is an example of the semiconductor memory device. The SRAM 100 may, for example, be used as the L1 data cache 93 illustrated in FIG. 10.

The SRAM 100 includes a sub array 110, an address decoder 120, a row selector 130A, a sub array selector 130B, and a column selector 130C.

The SRAM 100 further includes a word line driver (WL driver) 140, a final word line driver (final WL driver) 150, and a global selector (global-R/W select) 160.

The SRAM 100 further includes a local controller (local-R/W select & WL control) 170, a local block (local-R/W block) 180, and a global block (global-R/W block) 190.

The sub array 110 includes a plurality of the pseudo-multiport bit cells 30 disposed in a matrix. The pseudo-multiport bit cell 30 is an example of a pseudo-multiport cell. The sub array 110 is an example of a memory block. The bit cell 30 is similar to the respective bit cells 30 of the comparative examples of the SRAMs 50 and 60, and includes a circuit configuration illustrated in FIG. 4. Hence, the description of the circuit configuration of the bit cell 30 will be omitted.

FIG. 11 illustrated six bit cells 30 disposed at three columns in a column direction (i.e., in a horizontal direction in FIG. 11) and two rows in a row direction (in a vertical direction in FIG. 11). However, in practice, the sub array 110 includes further more bit cells 30 disposed in the column direction and in the row direction.

The sub array 110 includes two pairs of word lines WLA00 and WLB00, and WLA01 and WLB01; and three pairs of bit lines BL00 and BLB00, BL01 and BLB01, and BL02 and BLB02.

However, as described above, since the sub array 110 includes further more bit cells 30, the sub array 110 includes further more word lines and bit lines.

Note that in the following description, the A word lines WLA00 and WLA01 and the B word lines WLB00 and WLB01 may be illustrated separately.

The connecting relationships between the bit cells 30, the word lines WLA00, WLB00, WLA01, WLB01, and the bit lines BL00, BLB00, BL01, BLB01, BL02, BLB02 are similar to the connecting relationships between the bit cell 30, the word line WLA_L and WLB_L, and bit lines BL and BLB illustrated in FIG. 4.

The address decoder 120 is supplied with an input address included in a read instruction and a write instruction. Output terminals of the address decoder 120 are connected to input terminals of the row selector 130A, the sub array selector 130B, and the column selector 130C, respectively, via the signal lines 101A, 101B, and 101C indicated by arrows.

The input address is supplied to the address decoder 120 from the processor core 111 of the server 80 including the SRAM 100 (see FIG. 10 as reference). The input address includes a row address for specifying a row, a sub array address for specifying a sub array, and a column address for specifying a column address.

The address decoder 120 decodes a row address, a sub array address, and a column address included in the input address to generate row selection data, sub array selection data, and column selection data.

The address decoder 120 outputs the row selection data, the sub array selection data, and the column selection data to a row selector 130A, a sub array selector 130B, a column selector 130C, respectively.

An input terminal of the row selector 130A is connected to the address decoder 120 via a signal line 101A indicated by an arrow, and an output terminal of the row selector 130A is connected to a word line driver 140 via a signal line 102A indicated by an arrow.

The row selector 130A is configured to transmit the row selection data from the address decoder 120 to the word line driver 140. Note that the row selector 130A may include a decoding function to decode a part of the input address associated with the row selection data.

An input terminal of the sub array selector 130B is connected to the address decoder 120 via a signal line 101B indicated by an arrow, and an output terminal of the sub array selector 130B is connected to the word line driver 140 and a local controller 170 via signal lines 102B and 102C indicated by arrows.

The sub array selector 130B is configured to transmit the sub array selection data from the address decoder 120 to the word line driver 140 and the local controller 170. The sub array selector 130B is an example of a block selector to select a sub array 110A serving as an example of a memory block.

Note that the sub array selector 130B may include a decoding function to decode a part of the input address associated with the sub array selection data.

An input terminal of the column selector 130C is connected to the address decoder 120 via a signal line 101C indicated by an arrow, and an output terminal of the column selector 130C is connected to a local block 180 via a signal line 102D indicated by an arrow.

The column selector 130C is configured to transmit the column selection data from the address decoder 120 to the local controller 170. Note that the column selector 130C may include a decoding function to decode a part of the input address associated with the column selection data.

The word line driver (WL driver) 140 may be an example of the first word line driver. An input terminal of the word line driver 140 is connected to the row selector 130A and the sub array selector 130B via signal lines 102A and 102B indicated by arrows, respectively. An output terminal of the word line driver 140 is connected to a final word line driver 150 via a signal line 103A indicated by an arrow.

The word line driver 140 is configured to generate a word line selection signal WLA based on the row selection data input from the row selector 130A and the sub array selection data input from the sub array selector 130B. The word line driver 140 inputs the word line selection signal WLA into the final word line driver 150.

The final word line driver (final WL driver) 150 is configured to select a row (i.e., selects a word line) based on the word line selection signal WLA input from the word line driver 140 and the switching signal R/W input from the local controller 170.

The global selector (global-R/W select) 160 is configured to receive a write enable signal WE from the processor core 111 (see FIG. 10) of the server 80 including the SRAM 100.

An output terminal of the global selector 160 is connected to the local controller 170 via a signal line 104 indicated by an arrow. Note that in FIG. 11, only one local controller 170 is illustrated; however, in practice, there are two or more local controllers 170. The global selector 160 is configured to distribute the write enable signal WE to the plural local controllers 170.

An input terminal of the local controller (local-R/W select & WL control) 170 is connected to respective output terminals of the sub array selector 130B and the global selector 160 via the signal lines 102B and 104 indicated by arrows, respectively. An output terminal of the local controller 170 is connected to the final word line driver 150 and the local block 180 via the signal lines 103B and 105 indicated by arrows, respectively.

The local controller 170 is configured to generate a switching signal R/W based on the write enable selection data input from the sub array selector 130B and the write enable signal WE input from the global selector 160. The local controller 170 outputs the switching signal R/W into the final word line driver 150.

Further, the local controller 170 is configured to generate read/write control signals based on the write enable signal WE input from the global selector 160. The local controller 170 is configured to output the read/write control signals to the local block 180 via the signal line 105 indicated by an arrow.

Note that the local controller 170 is an example of a controller.

An input terminal of the local block (local-R/W block) 180 is connected to the column selector 130 and the local controller 170 via the signal lines 102D and 105 indicated by arrows, respectively. Further, a data input terminal of the local block 180 is connected to a global block 190 via a global bit line 191, and a data output terminal of the local block 180 is connected to the global block 190 via a global bit line 192.

Further, the local block 180 is connected to the bit cells 30 of the sub array 110 via the bit lines BL00, BLB00, BL01, BLB01, BL02, and BLB02.

The local block 180 is configured to retrieve data from or write data into the bit cells 30 of the sub array 110 based on the column selection data input from the column selector 130C and the read/write control signals input from the local controller 170.

The global block (global-R/W block) 190 is configured to perform data communications between the local block 180, and the processor core 91 of the server 80 (see FIG. 10) and the L2 cache 94.

In the following, a description is given of a physical arrangement and a connecting relationship of the SRAM 100 with reference to FIG. 12.

Figure 12:
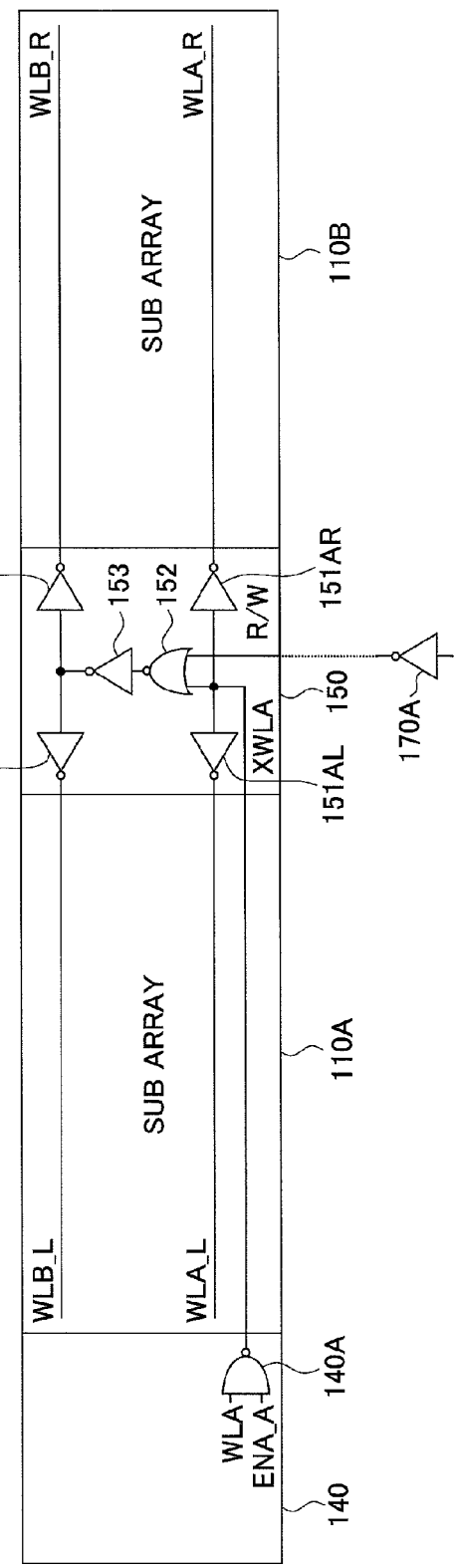
FIG. 12 is a first diagram illustrating a physical arrangement of the SRAM 100 of the embodiment.

FIG. 12 is a first diagram illustrating the physical arrangement of the SRAM 100 of an embodiment. Note that in FIG. 12, the elements similar to those illustrated in FIG. 11 are designated by the same reference numerals, and their descriptions will thus be omitted.

FIG. 12 illustrates a physical arrangement and connecting relationship of the sub arrays 110A, 110B, the word line driver 140, and the final word line driver 150 of the SRAM 100.

The configurations of the sub arrays 110A and 110B are similar to that of the sub array 110 illustrated in FIG. 11. In FIG. 12, only two sub arrays 110A and 110B are illustrated; however, in practice, there are further more sub arrays inside the SRAM 100.

The word line driver 140 includes a NAND logic part 140A. The NAND logic part 140A is supplied with a word line selection signal WLA and an enable signal ENA_A. The word line selection signal WLA is a selection signal for selecting a specific word line WLA_L of the plural word lines WLA_L and a specific word line WLA_R of the plural word lines WLA_R. The enable signal ENA_A is an enabling signal for activating the word lines WLA_L and WLA_R.

Note that the word lines WLA_L and WLB_L correspond to the word lines WLA00 and WLA01 illustrated in FIG. 11.

The final word line driver 150 includes the inverters 151AL and 151AR, a NOR logic part 152, and inverters 153, 154L, and 154R. The word line driver (WL driver) 150 may be an example of the second word line driver.

Input terminals of the inverter 151AL and 151AR and one of input terminals of the NOR logic part 152 (input terminal on a left hand side in FIG. 12) are connected to an output terminal of the NAND logic part 140A of the word line driver 140.

Respective output terminals of the inverters 151AL and 151AR are connected to word lines WLA_L and WLA_R of the sub arrays 110A and 110B.

Note that the inverters 151AL and 151AR are examples of output parts configured to output the word line selection signal WLA to one (A word line) of the pair of the word lines (A word line and B word line) of the bit cells 30 included in the sub arrays 110A and 110B.

A first input terminal of the NOR logic part 152 (input terminal on a left hand side in FIG. 12) is connected to an output terminal of the NAND logic part 140A of the word line driver 140, and a second input terminal (input terminal on a right hand side in FIG. 12) of the NOR logic part 152 is connected to an output terminal of the inverter 170A.

Note that the NOR logic part 152 is an example of a NOR logic part configured to output a result of NOR (i.e., negation of logical OR) of the word line selection signal WLA and the switching signal R/W to the other one (B word line) of the pair of the word lines (i.e., the pair of A word line and B word line).

The inverter 170A is included in the local controller 170 illustrated in FIG. 11, and configured to output the switching signal R/W to a second input terminal of the NOR logic part 152. Note that the connecting relationship on the input side of the inverter 140A will be described later.

The switching signal R/W is an example of a read/write selection signal configured to write into or retrieve from the bit cells 30.

An output terminal of the NOR logic part 152 is connected to an input terminal of the inverter 153.

An output terminal of the inverter 153 is connected to input terminals of the inverters 154L and 154R. Output terminals of the inverters 154L and 154R are connected to the word lines WLB_L and WLB_R of the sub arrays 110A and 110B, respectively.

Note that the word lines WLB_L and WLB_L correspond to the word lines WLB00 and WLB01 illustrated in FIG. 11.

Next, a description is given of a physical arrangement and a connecting relationship of the sub array 110, the row selector 130A, the sub array selector 130B, the column selector 130C, the word line driver 140, the final word line driver 150, the local controller 170, and the local block 180 of the SRAM 100.

Figure 13:
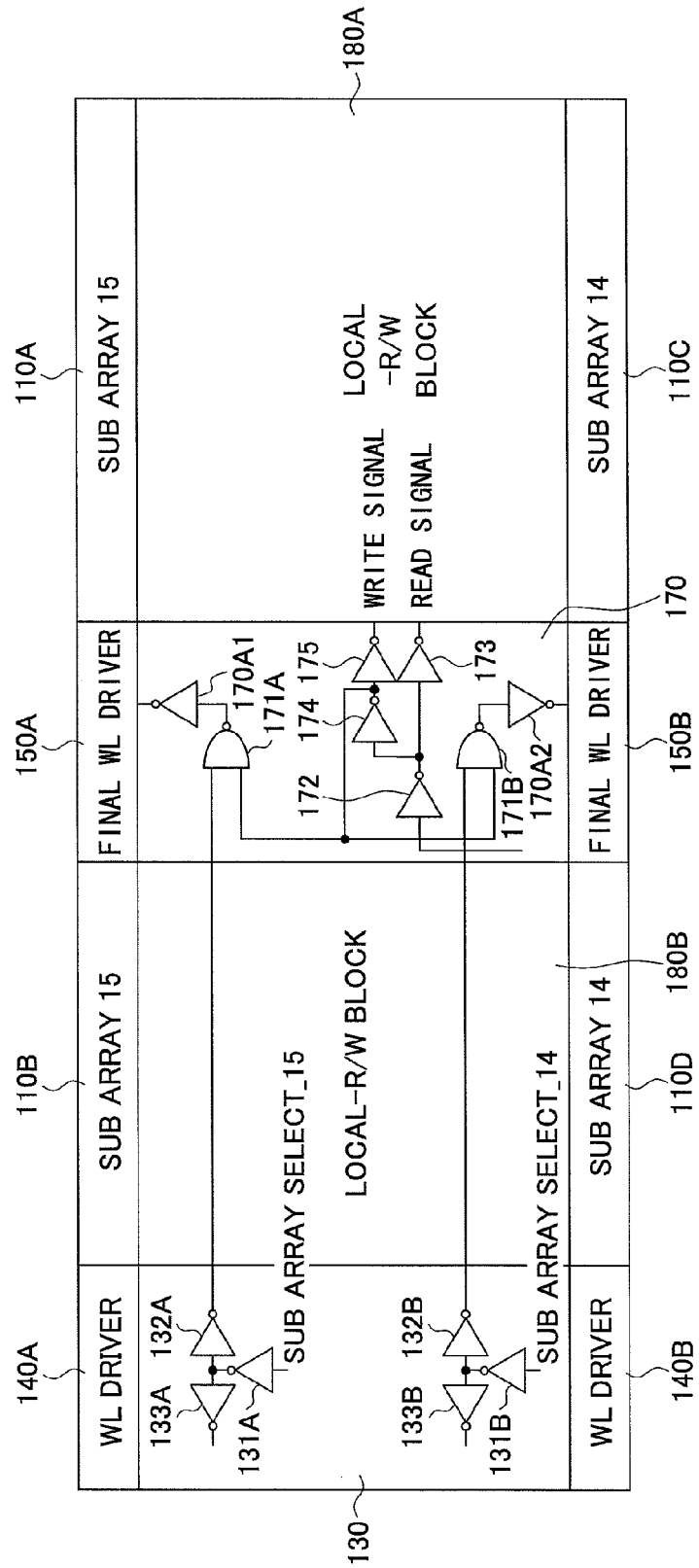
FIG. 13 is a second diagram illustrating the physical arrangement of the SRAM 100 of the embodiment.

FIG. 13 is a second diagram illustrating the physical arrangement of the SRAM 100 of an embodiment. Note that in FIG. 13, the elements similar to those illustrated in FIGS. 11 and 12 are designated by the same reference numerals, and their descriptions will thus be omitted.

FIG. 13 illustrates the sub arrays 110A, 110B, 110C, 110D, the selector 130, the word line drivers 140A, 140B, and the final word line drivers 150A, and 150B.

FIG. 13 further illustrates the local controller 170, and local blocks 180A and 180B.

Figure 14:
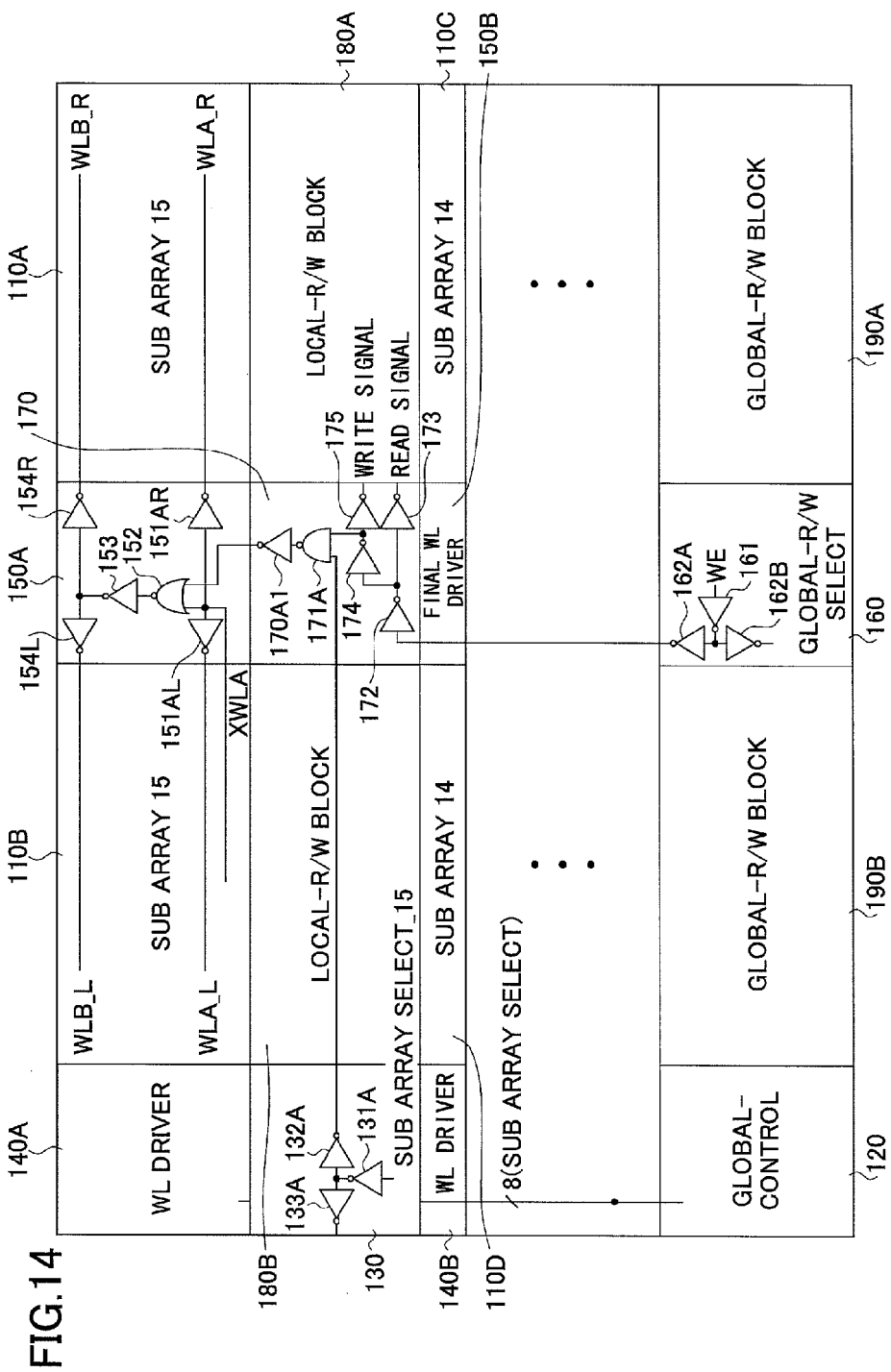
FIG. 14 is a third diagram illustrating the physical arrangement of the SRAM 100 of the embodiment.

FIG. 14 illustrates configurations of the four sub arrays 110A, 110B, 110C, and 110D, each of which is similar to that of the sub array 110 illustrated in FIG. 11. In this case, 16 sub arrays (sub array 0 to sub array 15) are disposed in a vertical direction in FIG. 13. The sub arrays 110C and 110A correspond to the 15$^{th}$ sub array (i.e., sub array 14), and the 16$^{th}$ sub array (i.e., sub array 15). Likewise, the sub arrays 110D and 110B correspond to the 15$^{th}$ sub array (i.e., sub array 14), and the 16$^{th}$ sub array (i.e., sub array 15).

Note that the sub arrays 110A and 110B correspond to the sub arrays 110A and 110B illustrated in FIG. 12.

The selector 130 represents the row selector 130A, the sub array selector 130B, and the column selector 130C as one block. The row selector 130A, the sub array selector 130B, and the column selector 130C may be implemented as one block inside the actual LSI.

Note that in this example, the row selector 130A, the sub array selector 130B, and the column selector 130C are represented by one selector 130 (one block). However, the row selector 130A, the sub array selector 130B, and the column selector 130C may alternatively be implemented as separate blocks, or may be incorporated into the address decoder 120 illustrated in FIG. 11.

FIG. 13 illustrates, of the components of the selector 130, the inverters 131A, 131B, 132A, 132B, 133A, and 133B. The inverters 131A, 131B, 132A, 132B, 133A, and 133B are included in the sub array selector 130B illustrated in FIG. 11.

The inverters 131A and 131B are supplied with sub array selection data (sub array select 14, 15) from the address decoder 120 illustrated in FIG. 11. An output terminal of the inverter 131A is connected to input terminals of the inverters 132A and 133A, and an output terminal of 131B is connected to input terminals of the inverters 132B and 133B.

An output terminal of the inverter 132A is connected to a first input terminal (an upper input terminal in FIG. 13) of the NAND logic part 171A of the local controller 170. Likewise, an output terminal of the inverter 132B is connected to a first input terminal (an upper input terminal in FIG. 13) of the NAND logic part 171B of the local controller 170.

The inverters 133A and 133B are, in practice, connected to a local controller (i.e., the local controller similar to the local controller 170 illustrated in FIG. 13) residing on a left hand side of the selector 130 in FIG. 13.

The configurations of the word line drivers 140A and 140B are similar to that of the word line driver 140 illustrated in FIG. 11. FIG. 13 illustrates two word line drivers 140A and 140B.

Note that the word line drivers 140A corresponds to the word line driver 140 illustrated in FIG. 12.

The configurations of the final word line drivers 150A and 150B are similar to that of the final word line driver 150 illustrated in FIG. 11. The final word line driver 150A of the two final word line drivers 150A and 150B corresponds to the final word line driver 150 illustrated in FIG. 12.

The local controller 170 includes inverters 170A1, 170A2, NAND logic parts 171A, 171B, and inverters 172, 173, 174 and 175.

Respective input terminals of the inverters 170A1 and 170A2 are connected to the output terminals of the NAND logic parts 171A and 171B, respectively. An output terminal of the inverter 170A1 is connected to a second input terminal (an input terminal on the left hand side in FIG. 12) of the NOR logic part 152 of the final word line driver 150A. The inverter 170A1 corresponds to the inverter 170A illustrated in FIG. 12.

Likewise, an output terminal of the inverter 170A2 is connected to a second input terminal of the NOR logic part of the final word line driver 150B.

The inverters 170A1 and 170A2 are configured to output the switching signal R/W to the second input terminal of the NOR logic part 152 of the final word line drivers 150A and 150B.

First input terminals (upper input terminals in FIG. 13) of the NAND logic parts 171A and 171B are connected to output terminals of the inverter 132A and 132B of the selector 130, respectively. Second input terminals (lower input terminals in FIG. 13) of the NAND logic parts 171A and 171B are both connected to an output terminal of the inverter 174.

Note that a combination of the inverter 170A1 and the NAND logic part 171A and a combination of the inverter 170A2 and the NAND logic part 171B each are examples of an AND logic part.

The inverter 172 is supplied with the write enable signal WE distributed inside the global selector 160 illustrated in FIG. 11. An output terminal of the inverter 172 is connected to input terminals of the inverters 172 and 174.

An input terminal of the inverter 173 is connected to an output terminal of the inverters 172, and an output terminal of the inverter 173 is connected to the local block 180A. The inverter 173 is configured to output a READ signal of the read/write control signals to the local block 180A.

An input terminal of the inverter 174 is connected to an output terminal of the inverter 172, and an output terminal of the inverter 174 is connected to second input terminals (lower input terminals in FIG. 13) of the NAND logic parts 171A and 171B.

An input terminal of the inverter 175 is connected to an output terminal of the inverters 174, and an output terminal of the inverter 175 is connected to the local block 180A. The inverter 175 is configured to output a WRITE signal of the read/write control signals to the local block 180A.

Note that FIG. 13 illustrates a circuit configuration of a part in which the READ signal and the WRITE signal are respectively output to the inverters 173 and 175 of the local controller 170 for convenience of illustration. However, the local controller 170 is also configured to output the READ signal and the WRITE signal of the read/write control signals to the local block 180B.

The configurations of the local blocks 180A and 180B are similar to that of the local block 180 illustrated in FIG. 11. Of the local blocks 180A and 180B, the local block 180A corresponds to the local block 180 illustrated in FIG. 11.

Next, a description will be given, with reference to FIG. 14, of a configuration of the SRAM 100 including the address decoder 120, the global selector 16, and the global block 190 illustrated in FIG. 11.

FIG. 14 is a third diagram illustrating the SRAM 100 of an embodiment. Note that in FIG. 14, the elements similar to those illustrated in FIGS. 11 to 13 are designated by the same reference numerals, and their descriptions will thus be omitted.

FIG. 14 illustrates the sub arrays 110A, 110B, 110C, 110D, the address decoder 120, the selector 130, the word line drivers 140A, 140B, and the final word line drivers 150A, and 150B.

FIG. 14 further illustrates the global selector 160, the local controller 170, the local blocks 180A and 180B, and the local blocks 190A and 190B.

The configurations of the sub arrays 110A, 110B, 110C, and 110D are similar to those of the sub arrays 110A, 110B, 110C, and 110D illustrated in FIG. 13. In FIG. 14, the word lines WLA_L, WLA_R, WLB_L, and WLB_R are typically illustrated for the sub arrays 110A and 110B in a manner similar to FIG. 12.

The address decoder 120 decodes a row address, a sub array address, and a column address included in the input address to generate row selection data, sub array selection data, and column selection data. In FIG. 14, the sub array selection data (sub array select) alone is illustrated. The sub array selection data are an example of data represented by the memory block selection signal.

Only the inverters 131A, 131B, 132A, 132B, 133A, and 133B are illustrated for the selector 130 in FIG. 14, and the inverters 131B, 132B, and 133B illustrated in FIG. 13 are omitted in FIG. 14.

The configurations of the word line drivers 140A and 140B are similar to those of the word line drivers 140A and 140B illustrated in FIG. 13; however, the word line driver 140A is illustrated in a size the same as the size of the word line driver 140 illustrated in FIG. 11.

The configurations of the final word line drivers 150A and 150B are similar to those of the final word line drivers 150A and 150B illustrated in FIG. 13. In FIG. 14, the internal circuits (i.e., the inverters 151AL and 151AR, a NOR logic part 152, and inverters 153, 154L, and 154R) are illustrated for the final word line driver 150A in a manner similar to the final word line driver 150 illustrated in FIG. 11.

The global selector 160 is disposed between the global blocks 190A and 190B. The global selector 160 includes inverters 161, 162A, and 162B.

The inverter 161 is supplied with the write enable signal WE transmitted from the processor core 111 (see FIG. 10) of the server 80 including the SRAM 100. An output terminal of the inverter 161 is connected to input terminals of the inverters 162A and 162B.

An input terminal of the inverter 162A is connected to an output terminal of the inverters 161, and an output terminal of the inverter 162A is connected to an input terminal of the inverter 172 of the local controller 170.

The write enable signal WE supplied to the inverter 161 is distributed to the inverters 162A and 162B at an output side of the inverter 161, and the write enable signal WE distributed to the inverters 162A and 162B is output from the global selector 160.

An output signal of the inverter 162 has a phase the same as the write enable signal WE, and hence, the inverter 172 of the local controller 170 is supplied with the write enable signal WE distributed inside the global selector 160.

The configuration of the local controller 170 is similar to that of the local controller 170 illustrated in FIG. 13; however, in FIG. 14, only the inverter 170A1, and the NAND logic part 171A, and the inverters 172, 173, 174 and 175 are illustrated, and the inverter 170A2, and the NAND logic part 171B illustrated in FIG. 13 are omitted from FIG. 14.

The configurations of the local blocks 180A and 180B are similar to those of the local blocks 180A and 180B illustrated in FIG. 13.

The configurations of the local blocks 180A and 180B are similar to that of the local block 190 illustrated in FIG. 11. The global blocks 190A and 190B are disposed one on each side of the global selector 160.

The global block 190 is configured to perform data communications between the local block 180A, and the processor core 91 of the server 80 (see FIG. 10) and the L2 cache 94. Likewise, the global block 190B is configured to perform data communications between the local block 180B, and the processor core 91 of the server 80 (see FIG. 10) and the L2 cache 94.

Next, a description is given of data writing and reading operations in the SRAM 100 of an embodiment.

When data are written (WRITE) into the SRAM 100, the L level write enable signal WE is supplied to the inverter 161 of the global selector 160. Hence, the write enable signals WE distributed by the global selector 160 are switched to L level.

When the L level write enable signal WE is supplied to the inverter 172 of the local controller 170, the READ signal of the read/write control signals output by the inverter 173 is switched to L level whereas the WRITE signal of the read/write control signals output by the inverter 175 is switched to H level.

At this time, since the output signal of the inverter 174 is at L level, an input signal of the second input terminal (an input terminal on the right hand side in FIG. 13) of the NAND logic part 171A is switched to L level. Further, at this time, since the sub arrays 110A and 110B are selected, the sub array selection data (sub array select 15) input to the selector 130 from the address decoder 120 are at H level.

Hence, the output signal of the NAND logic part 171A is switched to H level. This is because the NAND logic part 171A operates a NAND of the sub array selection data (sub array select 15) and the output of the inverter 174 based on the write enable signal WE.

As a result, the switching signal R/W output from the inverter 170A1 of the local controller 170 is switched to L level.

The L level switching signal R/W output from the inverter 170A1 of the local controller 170 is supplied to a second input terminal (an input terminal on the right hand side in FIG. 14) of the NOR logic part 152 of the final word line driver 150.

When the L level switching signal R/W is supplied to the input terminal (the input terminal on the right hand side in FIG. 14) of the NOR arithmetic unit 152, the output signal of the NOR logic part 152 is switched to an inverted signal level of the signal level of the selection signal XWLA input to the first input terminal (the input terminal on the left hand side in FIG. 14) of the NOR logic part 152.

Note that the signal level of the selection signal XWLA is an inverted signal level of the signal level of the word line selection signal WLA. Hence, when data are written (WRITE) into the SRAM 100, a signal level of the output signal of the NOR logic part 152 is equal to a signal level of the word line selection signal WLA. That is, the signal level of the output signal of the NOR logic part 15 is switched between the H level and L level according to the signal level of the word line selection signal WLA.

The output signal of the NOR logic part 152 inverted twice, first at the inverter 153 and then at the inverters 154L and 154R, and the inverted signals are output to the word lines WLB_L and WLB_R. That is, the word lines WLB_L and WLB_R are supplied with the control signals having a signal level equal to that of the word line selection signal WLA.

As a result, to write the data into the SRAM 100 (to perform data writing (WRITE) operations), the word lines WLB_L and WLB_R are activated when the word line selection signal WLA is at H level, and deactivated when the word line selection signals WLA is at L level.

Note that the word lines WLA_L and WLA_R are supplied with the inverted selection signals XWLA output from the inverters 151AL and 151AR. Hence, the word lines WLA_L and WLA_R are activated when the word line selection signal WLA is at H level, and deactivated when the word line selection signal WLA is at L level.

As described above, to write the data into the SRAM 100 (to perform data writing (WRITE) operations), the word lines WLA_L, WLA_R, WLB_L and WLB_R are activated when the word line selection signals WLA are at H level.

Hence, data may be written into the storage nodes N1 and N2 (see FIG. 4) of the pseudo-multiport bit cell 30.

Next, a description is given of data reading operations in the SRAM 100.

When data are retrieved (READ) from the SRAM 100, the H level write enable signal WE is supplied to the inverter 161 of the global selector 160. Hence, the write enable signals WE distributed by the global selector 160 are switched to H level.

When the H level write enable signal WE is supplied to the inverter 172 of the local controller 170, the READ signal of the read/write control signals output by the inverter 173 is switched to H level whereas the WRITE signal of the read/write control signals output by the inverter 175 is switched to L level.

At this time, since the output signal of the inverter 174 is at H level, an input signal of the second input terminal (an input terminal on the right hand side in FIG. 13) of the NAND logic part 171A is switched to H level. Further, at this time, since the sub arrays 110A and 110B are selected, the sub array selection data (sub array select 15) input to the selector 130 from the address decoder 120 are at H level.

Hence, the output signal of the NAND logic part 171A is switched to L level. As a result, the switching signal R/W output from the inverter 170A1 of the local controller 170 is switched to H level.

The H level switching signal R/W output from the inverter 170A1 of the local controller 170 is supplied to the second input terminal (the input terminal on the right hand side in FIG. 14) of the NOR logic part 152 of the final word line driver 150.

When the H level switching signal R/W is supplied to the input terminal (the input terminal on the right hand side in FIG. 14) of the NOR arithmetic unit 152, the output signal of the NOR logic part 152 is switched L level regardless of the signal level of the selection signal XWLA input to the first input terminal (the input terminal on the left hand side in FIG. 14) of the NOR logic part 152.

The output signal of the NOR logic part 152 inverted twice, first at the inverter 153 and then at the inverters 154L and 154R, and the inverted signals are output to the word lines WLB_L and WLB_R. That is, the word lines WLB_L and WLB_R constantly receive the L level control signals.

As a result, when data are retrieved (READ) from the SRAM 100, the word lines WLB_L and WLB_R are constantly retained at L level and deactivated.

Note that the word lines WLB_L and WLB_R are supplied with the inverted selection signals XWLA output from the inverters 151AL and 151AR. Hence, the word lines WLA_L and WLA_R are activated when the word line selection signal WLA is at the H level, and deactivated when the word line selection signal WLA is at the L level.

As described above, to read the data into the SRAM 100 (to perform data reading (READ) operations), the word lines WLA_L and WLA_R are activated when the word line selection signal WLA is at H level. Further, at this moment, the word lines WLB_L and WLB_R are constantly retained at L level, and deactivated.

Hence, data retained in the storage nodes N1 and N2 (see FIG. 4) of the pseudo-multiport bit cell 30 may be retrieved.

As described above, data may be written into the storage nodes N1 and N2 (see FIG. 4) of the pseudo-multiport bit cell 30 by activating the A word lines (WLA_L/R) and the B word lines (WLB_L/R).

On the other hand, data retained in the storage node N2 (see FIG. 4) of the pseudo-multiport bit cell 30 may be retrieved by activating the A word lines (WLA_L/R) without activating the B word lines (WLB_L/R).

That is, the SRAM 100 having the pseudo-multiport bit cells 30 is operated as single port memory.

The aforementioned data writing (WRITE) operations and reading (READ) operations in the SRAM 100 are similar to the data writing (WRITE) operations and reading (READ) operations (see FIG. 9) of the comparative example of SRAM 60 (see FIG. 8).

Further, the SRAM 100 of the embodiment may be able to reduce electrical power consumption according to the following reasons.

The final word line driver 150A has a configuration of the comparative example of the SRAM 50 illustrated in FIG. 6 to which the NOR logic part 152 and the inverter 153 are added.

Note that the final word line driver 150A includes the inverter 153 at an output side of the NOR logic part 152. Further, the inverters 154L and 154R are connected to the output side of the inverter 153.

When the inverters 154L and 154R are connected to the output side of the inverter 153, the size of the inverter 153 may be reduced by one-fourth of a total size of the inverters 154L and 154R due to a so-called Fan Out of Four (FO4) effect.

In addition, the size of the NOR logic part 152 may be reduced by one-fourth of the inverter 153 by connecting the inverter 153 to the output side of the NOR logic part 152.

Further, there are 16 pairs of the A word lines (WLA_L/R) and B word lines (WLB_L/R) in each of the sub arrays 110A and 110B. That is, there are 16 NOR logic parts 152 in each of the final word line drivers 150A. A common (one) inverter 170A1 is connected to the second input terminals (e.g., the input terminal on the right hand side in FIG. 14) of the 16 NOR logic parts 152.

Hence, the size of the inverter 170A1 may be reduced by one-fourth of the size of the 16 NAND logic parts 170A1 due to the so-called FO4 effect.

In addition, the inverter 170A1 is connected to an output side of the inverter 171. Hence, the size of the inverter 171 may be reduced by one-fourth of the size of the inverter 170A1 due to the FO4 effect.

For example, the size of each of the inverters 151AL, 151AR, 154L, and 154R is determined as "8". Since the inverter 153 supplies the control signals to the inverters 154L and 154R, it is sufficient that the size of the inverter 153 is "4" (=("8"+"8")/4), and the size of the NOR logic part 152 is "1", due to the FO4 effect.

Further, in this case, there are 16 NOR logic parts 152 having the size of "1", and the size of the inverter 170A1 is one-fourth of a total size of 16 NOR logic parts 152. Thus, the size of the inverter 170A1 is "4".

Further, the size of the inverter 171A is one-fourth of the size of the inverter 170A1, so the size of the inverter 171A is "1".

Note that the sizes of the NOR logic parts 64L and 64R of the final word line driver 64 of the SRAM 60 illustrated in FIG. 8 are both "8". Hence, it may be necessary that the size of the inverter 65 illustrated in FIG. 8 is "64".

As described above, in the SRAM 100 of the embodiment, the NOR logic part 152 and the inverter 153 of the final word driver 150A may be reduced in size. Hence, the final word driver 150A of the SRAM 100 may be able to reduce electrical power consumption compared to electrical power consumed by the final word line driver 64 of the comparative example of the SRAM 60 illustrated in FIG. 8. Note that the final word line driver 150B may be able to reduce electrical power consumption in a manner similar to the electrical power consumption reduced by the final word line driver 150A.

In addition, the size (i.e., "4") of the inverter 170A1 of the local controller 170 is 1/16 of the size (i.e., "64") of the inverter 65 in the SRAM 60 illustrated in FIG. 8. Hence, the electrical power consumption may further be reduced due to the reduction in size of the inverter 171A1.

As described above, it may be possible to reduce the electrical power consumption while the SRAM 100 having the pseudo-multiport bit cells 30 is operated as single port memory.

Further, in the SRAM 100 of the embodiment, the A word lines (WLA_L/R) is activated via the inverters 151AL and 151AR of the final word line driver 150A to retrieve data. In the comparative example of the SRAM 50 illustrated in FIG. 6 and the comparative example of the SRAM 60, the data are retrieved in a manner similar to the SRAM 100 of the embodiment as described above. Hence, the speed of retrieving (reading) the data is similar to those of the comparative examples of the SRAMs 50 and 60 illustrated in FIGS. 6 and 8, respectively.

On the other hand, in the SRAM 100 of the embodiment, the B word lines (WLB_L/R) is activated via the NOR logic part 152, the inverters 151AL and 151AR of the final word line driver 150A to write data.

This indicates that the B word lines (WLB_L/R) is delayed by the NOR logic part 152 and the inverter 153, compared to the SRAM 50 illustrated in FIG. 6.

However, in the SRAMs that generally exhibit higher data reading/writing speeds, the data writing speed does not become much interfered with compared to the data reading speed.

Accordingly, an adverse effect on the data writing speed due to the SRAM having the NOR logic part 152 and the inverter 153 may be minimum, thereby little affecting the reading/writing operations.

Further, the SRAM 100 having the pseudo-multiport bit cells 30 may be able to reduce electrical power consumption while being operated as single port memory.

Hence, memory fabrication cost may be reduced by forming memory for performing multiport operations and the SRAM 100 capable of being operated as a single port.

In addition, it may be possible to cancel out fabrication variability in the bit cells operating as the multiport bit cells and the bit cells operating as the single port bit cells, and improve the operating properties.

According to the embodiments, it may be possible to provide the semiconductor memory device capable of exhibiting reduced power consumption and the information processing apparatus having such a semiconductor memory device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory device, comprising:
a plurality of memory blocks including a plurality of pseudo-multiport cells;
an address decoder configured to decode an address specifying one of the pseudo-multiport cells included in the memory blocks;
a first word line driver configured to output a word line selection signal selecting one of word lines of the one of the pseudo-multiport cells included in the memory blocks based on a row address included in the address output from the address decoder; and
a second word line driver having an output part configured to output the word line selection signal into a first one of a pair of the word lines of the one of the pseudo-multiport cells included in the memory blocks, and a NOR logic part configured to output a result of NOR of the word line selection signal and a read/write selection signal into a second one of the pair of the word lines, the read/write selection signal selecting one of a writing operation to write data into the one of the pseudo-multiport cells or a reading operation to read data from the one of the pseudo-multiport cells, wherein the second word line driver activates the pair of the word lines for writing data into the one of the pseudo-multiport cells, and activates the first one of the pair of the word lines for reading data from the one of the pseudo-multiport cells.

2. The semiconductor memory device as claimed in claim 1, further comprising:
a block selector configured to output a memory block selection signal selecting one of the memory blocks based on a block address specifying a corresponding one of the memory blocks contained in the address;
a controller including an AND logic part configured to operate an AND of a write enable signal representing as to whether to write data into the one of the pseudo-multiport cells included in the memory blocks and the memory block selection signal output from the block selector, wherein the controller outputs a high level read/write selection signal for writing data into the one of the pseudo-multiport cells, and outputs a low level read/write selection signal for reading data from the one of the pseudo-multiport cells.

3. The semiconductor memory device as claimed in claim 2, wherein
the AND logic part includes a NAND logic part and an inverter connected to an output side of the NAND logic part.

4. The semiconductor memory device as claimed in claim 1, wherein
the second word line driver includes an even number of inverters connected in series and configured to output the NOR into the second one of the pair of the word lines.

5. An information processing apparatus, comprising:
a semiconductor memory device including
a plurality of memory blocks including a plurality of pseudo-multiport cells;
an address decoder configured to decode an address specifying one of the pseudo-multiport cells included in the memory blocks;
a first word line driver configured to output a word line selection signal selecting one of word lines of the one of the pseudo-multiport cells included in the memory blocks based on a row address included in the address output from the address decoder; and
a second word line driver having an output part configured to output the word line selection signal into a first one of a pair of the word lines of the one of the pseudo-multiport cells included in the memory blocks, and a NOR logic part configured to output a result of NOR of the word line selection signal and a read/write selection signal into a second one of the pair of the word lines, the read/write selection signal selecting one of a writing operation to write data into the one of the pseudo-multiport cells or a reading operation to read data from the one of the pseudo-multiport cells, wherein the second word line driver activates the pair of the word lines for writing data into the one of the pseudo-multiport cells, and activates the first one of the pair of the word lines for reading data from the one of the pseudo-multiport cells; and an arithmetic processing unit configured to write data into the one of the pseudo-multiport cells of the semiconductor memory device or read data from the one of the pseudo-multiport cells of the semiconductor memory device.

* * * * *